United States Patent
Lim

(10) Patent No.: US 7,881,099 B2
(45) Date of Patent: Feb. 1, 2011

(54) MULTIBIT MAGNETIC RANDOM ACCESS MEMORY DEVICE

(75) Inventor: Chee-kheng Lim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/364,351

(22) Filed: Feb. 2, 2009

(65) Prior Publication Data

US 2009/0201720 A1  Aug. 13, 2009

Related U.S. Application Data

(62) Division of application No. 11/117,352, filed on Apr. 29, 2005, now Pat. No. 7,502,248.

(60) Provisional application No. 60/587,084, filed on Jul. 13, 2004.

(30) Foreign Application Priority Data

May 21, 2004  (KR) .......................... 2004-0036380

(51) Int. Cl.
G11C 11/00 (2006.01)
G11C 11/14 (2006.01)
(52) U.S. Cl. .................. 365/158; 365/171; 365/173
(58) Field of Classification Search ............ 365/158, 365/171, 173
See application file for complete search history.

(56) References Cited

U.S. PATENT DOCUMENTS

| | | | |
|---|---|---|---|
| 5,930,164 A | 7/1999 | Zhu | |
| 5,936,293 A * | 8/1999 | Parkin | 365/158 |
| 6,134,138 A * | 10/2000 | Lu et al. | 365/158 |
| 6,404,673 B1 | 6/2002 | Matsui | |
| 6,507,513 B1 * | 1/2003 | Sharma et al. | 365/158 |
| 6,525,957 B1 | 2/2003 | Goronkin et al. | |
| 6,577,529 B1 | 6/2003 | Sharma et al. | |
| 6,590,806 B1 | 7/2003 | Bhattacharyya | |
| 6,657,889 B1 | 12/2003 | Subramanian et al. | |
| 6,667,901 B1 | 12/2003 | Perner et al. | |
| 6,674,662 B1 * | 1/2004 | Hillebrands et al. | 365/158 |
| 6,683,806 B2 * | 1/2004 | Drewes | 365/158 |
| 6,711,052 B2 | 3/2004 | Subramanian et al. | |
| 6,714,440 B2 | 3/2004 | Subramanian et al. | |
| 6,717,843 B1 | 4/2004 | Thewes et al. | |

(Continued)

FOREIGN PATENT DOCUMENTS

JP    2000-331473 A    11/2000

(Continued)

*Primary Examiner*—Trong Phan
(74) *Attorney, Agent, or Firm*—Sughrue Mion, PLLC

(57) ABSTRACT

A multi-bit magnetic random access memory device and a method for writing to and sensing the multi-bit magnetic random access memory device. The magnetic memory includes a memory cell with a multilayer structure having a plurality of data layers which can each store one bit. The structure includes a plurality of magnetically changeable ferromagnetic layers, a ferromagnetic reference layer having a fixed magnetization state, a first spacer layer separating the magnetically changeable ferromagnetic layers, and a second spacer layer separating the ferromagnetic reference layer from the magnetically changeable ferromagnetic layers. This structure allows for more than one-bit to be stored as well as for efficient writing and reduced power consumption.

26 Claims, 13 Drawing Sheets

U.S. PATENT DOCUMENTS

| | | |
|---|---|---|
| 6,829,161 B2 | 12/2004 | Huai et al. |
| 6,865,109 B2 | 3/2005 | Covington |
| 6,870,761 B2 | 3/2005 | Johnson |
| 6,879,512 B2 | 4/2005 | Luo |
| 6,888,746 B2 * | 5/2005 | Johnson ............... 365/158 |
| 6,911,710 B2 * | 6/2005 | Nickel et al. ........... 365/158 |
| 6,927,995 B2 | 8/2005 | Nickel et al. |
| 6,954,372 B2 * | 10/2005 | Matsukawa et al. ..... 365/158 |
| 6,956,764 B2 * | 10/2005 | Engel et al. ............ 365/158 |
| 6,977,181 B1 | 12/2005 | Raberg |
| 6,980,469 B2 * | 12/2005 | Kent et al. ............. 365/158 |
| 6,985,385 B2 | 1/2006 | Nguyen et al. |
| 6,992,359 B2 | 1/2006 | Nguyen et al. |
| 7,020,009 B2 | 3/2006 | Ho et al. |
| 7,023,724 B2 | 4/2006 | Katti |
| 7,050,325 B2 * | 5/2006 | Iwata et al. ............ 365/158 |
| 7,061,787 B2 | 6/2006 | Trouilloud et al. |
| 7,064,976 B2 | 6/2006 | Johnson |
| 7,095,646 B2 * | 8/2006 | Slaughter et al. ....... 365/158 |
| 7,102,916 B2 | 9/2006 | Trouilloud et al. |
| 7,109,539 B2 | 9/2006 | Lu |
| 7,129,098 B2 | 10/2006 | Rizzo et al. |
| 7,149,105 B2 | 12/2006 | Brown et al. |
| 7,184,300 B2 | 2/2007 | Savtchenko et al. |
| 7,190,611 B2 | 3/2007 | Nguyen et al. |
| 7,206,223 B1 | 4/2007 | Nahas et al. |
| 7,218,556 B2 * | 5/2007 | Kim et al. .............. 365/158 |
| 7,298,643 B2 * | 11/2007 | Kim et al. .............. 365/158 |
| 7,420,837 B2 * | 9/2008 | Hung et al. ............ 365/158 |
| 2002/0175386 A1 | 11/2002 | Kim et al. |
| 2003/0185045 A1 | 10/2003 | Drewes |
| 2004/0076036 A1 | 4/2004 | Heide |
| 2004/0090844 A1 | 5/2004 | Nickel et al. |

FOREIGN PATENT DOCUMENTS

| | | |
|---|---|---|
| JP | 2003-124446 A | 4/2003 |

* cited by examiner

Ms1 > Ms2

$Hy = r_y (N_y - N_x) Ms2$
$Hx = r_x Hy = r_x r_y (N_y - N_x) Ms2$
$Ms1 = R \, Ms2$
Hy is always +y direction
Hx can be + or −
Initial M is in −x direction → Anisotropy field $Hk1 = (N_y - N_x) Ms1 > Hk2 = (N_y - N_x) Ms2$

_US 7,881,099 B2_

MULTIBIT MAGNETIC RANDOM ACCESS MEMORY DEVICE

CROSS-REFERENCE TO RELATED APPLICATIONS

This is a divisional of application Ser. No. 11/117,352 filed Apr. 29, 2005 now U.S. Pat. No. 7,502,248, which claims priority from U.S. Provisional Patent Application No. 60/587,084 filed on Jul. 13, 2004 and Korean Patent Application No. 2004-0036380 filed May 21, 2004. The entire disclosures of the prior applications, are considered part of the disclosure of the accompanying divisional application and are hereby incorporated by reference.

BACKGROUND OF THE INVENTION

1. Field of the Invention

The present invention relates to magnetic random access memory, and more particularly to a multi-bit magnetic random access memory device and a method for writing to and for sensing the multi-bit magnetic random access memory device.

2. Description of the Related Art

Rapid growth in digital information generation is likely to face a new wave of explosion in high density memory demand due to the growing popularity of mobile devices. Magnetic random access memory (MRAM) is one of the most promising candidates to provide energy efficient and non-volatile memories.

The most attractive advantages of MRAM are that the mobile device retains the current state of work when powered down, and, additionally, longer battery run-times can be provided for mobile devices from notebook computers to cellphones, since non-volatility enables MRAM chips to consume less power than conventional Dynamic Random Access Memory (DRAM) and Static Random Access Memory (SRAM). MRAM operates on the principle of storing data bits using magnetic charges instead of electrical charges as used by DRAM and SRAM.

In the related art, an MRAM is known where one bit of information is stored in a magnetic multilayer cell, which comprises both magnetic and non-magnetic layers. As shown in FIG. 9, in its simplest form, a magnetic multilayer memory cell 90 includes four layers. These layers include an antiferromagnetic layer 91, and two ferromagnetic layers 92, 93 separated by a non-magnetic spacer layer 94.

The non-magnetic spacer layer 94 may either be conductive or non-conductive. In a memory having a conductive spacer, a spin-valve element is created, while a memory having a non-conductive spacer layer produces a magnetic tunnel junction (MTJ) magnetoresistive element.

One of the ferromagnetic layers 93 is exchange-coupled to the antiferromagnetic layer 91, effectively pinning the orientation of magnetization in the ferromagnetic layer 93. This ferromagnetic layer 93 is known as the pinned layer.

When an external magnetic field is applied to such a cell, the magnetization of the other ferromagnetic layer 92, the so-called free layer (the non-pinned layer), will react to the field.

Sensing or reading the information stored in the cell is based on a magnetoresistance effect.

The electrical resistance of such a multilayer cell 90 depends on the relative orientation of the magnetization in the two ferromagnetic layers 92, 93. In this case, there is low resistance when both magnetization orientations are in parallel (P) alignment and high resistance when they are in antiparallel (AP) alignment.

The building block of the MRAM architecture is its crossed-wires structure, where a magnetic element is located at the intersection point of two orthogonal wires. The writing or addressing process of an MRAM cell is accomplished by applying two orthogonal magnetic field pulses, generated by sending an electrical current, down the wires. The two wires are often referred to as the word line (Hy field, along the short axis of the magnetic element) and the bit line (Hx field, along the long axis (or easy axis) of the magnetic element).

The strength of the magnetic fields applied are such that one field alone cannot switch the magnetization of a magnetic element, but rather it requires the combination of both magnetic fields from the word and bit lines, for cell selectivity. However, the present cell writing technology relies on applying a long magnetic field pulse, tens of nanoseconds, long enough for the magnetization to reach the final equilibrium state. This method of writing is also known as the quasistatic writing which is not only slow but also not energy efficient.

Also, in such a memory having a multilayer cell structure, there is a limitation of memory density. In most cases, only one bit of information can be stored at the cross-point (the intersection point of the two orthogonal wires) in the MRAM architecture.

Recent attempts have been made to overcome this limitation of memory density. For example, U.S. Patent Publication 2003/0209769 to Nickel et al. discloses an MRAM device having a multi-bit memory cell. In particular, each memory cell includes two magnetoresistive devices connected in series.

Each of the two magneto-resistive devices has sense layers with distinctly different coercivities and, therefore, requires different writing currents. Thus, write operations can be performed selectively on the two magneto-resistive devices. Each multi-bit memory cell has four logic states with different resistance values in each state. This allows for storage of more data than a related art single-bit memory cell, which has only two logic states.

U.S. Pat. No. 5,930,164 to Zhu also discloses a magnetic memory device having four logic states and an operating method thereof The memory device of Zhu includes a multibit system accomplished by stacking two or more memory cells on top of each other separated by a thick conductive layer to prevent magnetic coupling between memory cells.

In Zhu, each memory cell comprises a free magnetic data layer to store one bit of information, a hard magnetic layer as a reference layer, and a barrier layer between the free and hard magnetic layer. Essentially, each memory cell is an independent MTJ device. The memory cells have distinct coercivities, therefore allowing independent cell writing by one or two magnetic fields. For sensing or reading process, these memory cells have different Magnetoresistance (MR) ratios, therefore creating four resistance states for sensing of multi-bit information. The writing method, however, relies on a quasistatic writing method which is not only slow, but also not energy efficient.

U.S. Pat. No. 5,703,805 to Tehrani et al. discloses a method for detecting information stored in an MRAM cell having two magnetic layers with different thicknesses.

In the Tehrani et al. device, there are two magnetic data layers separated by a non-magnetic spacer. Each magnetic data layer can store one bit of information. A writing process for this device uses differing coercive forces for the two magnetic data layers, hence, independent writing is possible using a quasistatic method. A quasistatic writing method relies on applying a long magnetic field pulse of several nanoseconds that is long enough for the magnetization of a cell to reach a final equilibrium state. As noted above, this method of switching is not only slow, but also not energy efficient.

Further, the reading process of the Tehrani et al. device is very complex since six magnetic fields are required to determine the state in each data layer separately. This creates a slow and inefficient reading process.

Finally, U.S. Pat. No. 6,590,806 to Bhattacharyya discloses a device having two magnetic data layers separated by a pair of antiferromagnetically coupled magnetic layers. The two free magnetic data layers have distinct coercivities and hence, independent writing is possible.

The Bhattacharyya device has four resistance states depending on the magnetic configuration of the free data layers to the antiferromagnetically coupled layers. Therefore, the reference layer for the magnetoresistance effect are the pair of antiferromagnetic coupled layers. This means that if this device is to be used for additional data layers, each data layer requires one pair of antiferromagnetic layers, providing for a complicated device structure. Also, the device relies on the conventional quasistatic writing method.

Further, the manufacturing process of related art MRAM devices has only been known to produce low yields of the memory due to high sensitivity to cell defects, which causes domain nucleation, and hence, wide switching field distribution.

SUMMARY OF THE INVENTION

Illustrative, non-limiting embodiments of the present invention overcome the above disadvantages and other disadvantages not described above. Also, the present invention is not required to overcome the disadvantages described above, and an illustrative, non-limiting embodiment of the present invention may not overcome any of the problems described above.

According to an aspect of the present invention, a multi-bit magnetic random access memory is provided that improves the memory density of MRAM, and also simplifies the memory fabrication process by reducing the number of electrical current lines.

The multi-bit MRAM device disclosed in exemplary embodiments herein is a magnetoresistance memory device designed to store more than one bit of information at one intersection between the bit and word lines. In one exemplary embodiment, two independent information bits are stored in two magnetically changeable ferromagnetic layers where each layer holds a single bit of binary information.

Of course, memory cells have holding more than two bits of information are also disclosed, and one of ordinary skill in the art will recognize that multiple bit cells may be realized using the same principles as for the two bit cell.

More particularly, in one exemplary embodiment of the invention, the magnetic memory comprises two magnetically changeable ferromagnetic layers, a ferromagnetic reference layer having a fixed magnetization state, a first spacer layer separating the magnetically changeable ferromagnetic layers, and a second spacer layer separating the ferromagnetic reference layer from the magnetically changeable ferromagnetic layers.

According to another aspect of the present invention, a memory that allows for fast and efficient switching is provided. In exemplary embodiments herein, the switching process may be accomplished by spin precessional switching. Except for high operation frequencies, spin precessional switching is energy efficient because it requires a lower switching field as compared to the aforementioned quasistatic writing process. Shorter field pulses further reduce power consumption.

The writing scheme disclosed in an exemplary embodiment of the invention uses the spin precessional nature of ferromagnetic material in which an easy axis magnetic field (+Hx or −Hx) used to define the final state of the memory (1 or 0) is combined with an orthogonal hard axis excitation field (+Hy or −Hy) to initiate spin precession. In this switching process, neither the Hx field nor the Hy field alone is able to switch the magnetization. Rather, the combination of the Hx and Hy fields is the essence of selective writing in the memory array. Spin precessional switching as used in an exemplary embodiment of the present invention uses a fast Hy field, in the order of 1 ns or less.

In another exemplary embodiment of the invention, the Hy excitation field pulse is required to have a very short rise time (<0.5 ns), and pulse duration is of the half the magnetic spin precession period.

Ultra-fast magnetization switching dynamics is governed by the damped precession of magnetization about an effective magnetic field, $H_{eff}$. The effective magnetic field $H_{eff}$ is the sum of the applied fields and the magnetic anisotropy field of the memory cell which is dominated by the shape anisotropy.

The motion of magnetization M is described by the Landau-Liftshitz-Gilbert (LLG) equation, $dM/dt = -\gamma(M \times H_{eff}) + (\alpha/Ms)(M \times dM/dt)$, where M is the magnetization vector, $\gamma$ is the gyro-magnetic constant, $\alpha$ is the phenomenological Gilbert damping constant, and Ms is the saturation magnetization. In the case of MRAM, the effective magnetic field is the vector sum of the Hx and Hy. In particular, the LLG equation indicates magnetization change of a ferromagnetic layer according to time under an external magnetic field. Here, the ferromagnetic layer may be the second ferromagnetic layer M2 in FIG. 6. Also, the first term in LLG equation indicates the affection that electron spins of the ferromagnetic layer affect the magnetization change.

A fast rising magnetic field pulse applied orthogonal to the M direction will generate a large torque, $\gamma(M \times H_{eff})$. As a result, M is excited into precession around the effective field direction. The first term in the LLG equation is the precession term, which describes the spin precession, and the second term is the energy dissipation term that dictates the rate of energy dissipation. Adapting spin precessional switching promises high-energy efficiency as well as an ultrafast switching speed.

One of the most important natures in precessional switching of the invention is that the precession frequency f depends on the effective magnetization and effective applied magnetic field. It can be expressed as $f^2 = (\gamma/2\pi)^2(H_{eff} + M_{eff}) + H_{eff}$, where $\gamma = 28$ GHz/T. This is also known in the art as the Kittel formula. The equation leads to the fact that it is possible to manipulate the spin precession frequency by controlling the effective magnetization and effective field experienced by the spin.

Accordingly, a writing method according to an exemplary embodiment of the invention, for a magnetic memory includes applying a first magnetic field below a switching field along a long axis of the memory cell, and applying a second magnetic field orthogonal to the first magnetic field, wherein the first magnetic field is turned-off after the second magnetic field is turned-off In another exemplary embodiment, the second magnetic field is turned-off as soon as the magnetization of the one cell has precessed to more than about ½ but less than about ¾ of the precession cycle. The first magnetic field is kept constant for a certain time duration (>0.5 ns) after the second magnetic field is turned-off, or in other words, the magnetic field duration of Hy is always shorter than Hx.

In this exemplary embodiment, the first magnetic field is applied along the horizontal axis and is used to define the final magnetization state of the cell intended for switching. The second magnetic field is referred to as the spin precessional excitation field (along the word line).

BRIEF DESCRIPTION OF THE DRAWINGS

The above aspects of the present invention will become more apparent by describing in detail exemplary embodiments thereof with reference to the attached drawings in which.

DETAILED DESCRIPTION OF EXEMPLARY EMBODIMENTS OF THE PRESENT INVENTION

Figure 1:
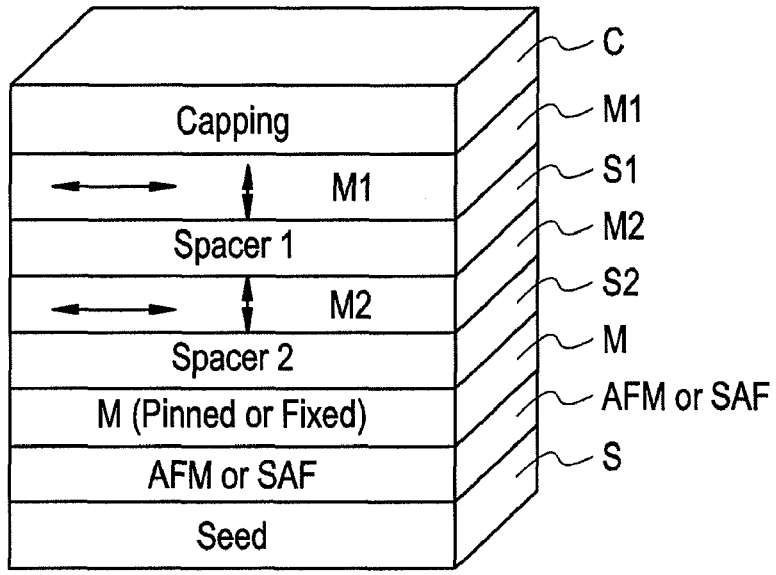
FIG. 1 schematically illustrates a memory according to an exemplary embodiment the present invention.

Hereinafter, exemplary embodiments of the present invention will be described in detail with reference to the accompanying drawings.

Aspects of the present invention, and methods for achieving them will be apparent to those skilled in the art from the detailed description of the exemplary embodiments together with the accompanying drawings. However, the scope of the present invention is not limited to the exemplary embodiments disclosed in the specification, and the present invention can be realized in various types. The described exemplary embodiments are presented only for completely disclosing the present invention and helping those skilled in the art to completely understand the scope of the present invention, and the present invention is defined only by the scope of the claims. Like reference numerals and labels refer to like elements throughout the specification.

FIG. 1 schematically shows a first exemplary embodiment of the present invention. FIG. 1 illustrates a storage node 10, which is a Magnetic Tunneling Junction layer, of an MRAM cell consisting of a transistor and the storage node 10. The storage node 10 includes magnetic and non-magnetic multi-layers.

The bottom layer as shown is a seed layer S which can be magnetic or non-magnetic, or a combination thereof.

Magnetic layer M is fixed or pinned by means of exchange bias effect with an antiferromagnetic layer (AFM) or interlayer coupling via a synthetic antiferromagnetic layer (SAF).

A non-magnetic spacer layer S1 is accommodated between magnetically changeable ferromagnetic layers M1 and M2. S1 may be either a conductive or nonconductive layer. In the case for a conductive spacer layer, the memory device forms a Giant Magnetoresistance (GMR) structure. On the other hand, a non-conductive layer leads to a Magnetic Tunnel Junction (MTJ) structure.

Magnetic layers M1 and M2 are the data layers where information is stored. Magnetization of layers M1 and M2 can be changed via an externally applied magnetic field and/or a spin-polarized electrical current (not shown).

Layers M1 and M2 may also have distinct magnetic and physical properties such as saturation magnetization, magnetic anisotropy, layer thickness, magnetostriction coefficient, coercivity, damping constant, and materials, among others.

Additionally, layers M1, M2 may include differing ferromagnetic materials, allowing for more efficient spin precession, as well as a same or differing thickness. In exemplary embodiments, the material may comprise an alloy of Ni, Fe, and Co, or a combination thereof Additionally, magnetic layers M, M1 and M2 can have either in-plane or out-of-plane magnetization.

The magnetoresistance effect or change in electrical resistance with magnetization is achieved by changing the magnetization configuration in magnetic layers M1, and M2.

The total change in resistance for current propagating through layers M/S2/M2 must be different from the total resistance change for current propagating through layers M2/S1/M1.

A top capping layer C may be included in the cell structure. The capping layer C has the function of protection against corrosion of the cell, and also may increase the Gilbert damping constant in layer M1.

Figure 13:
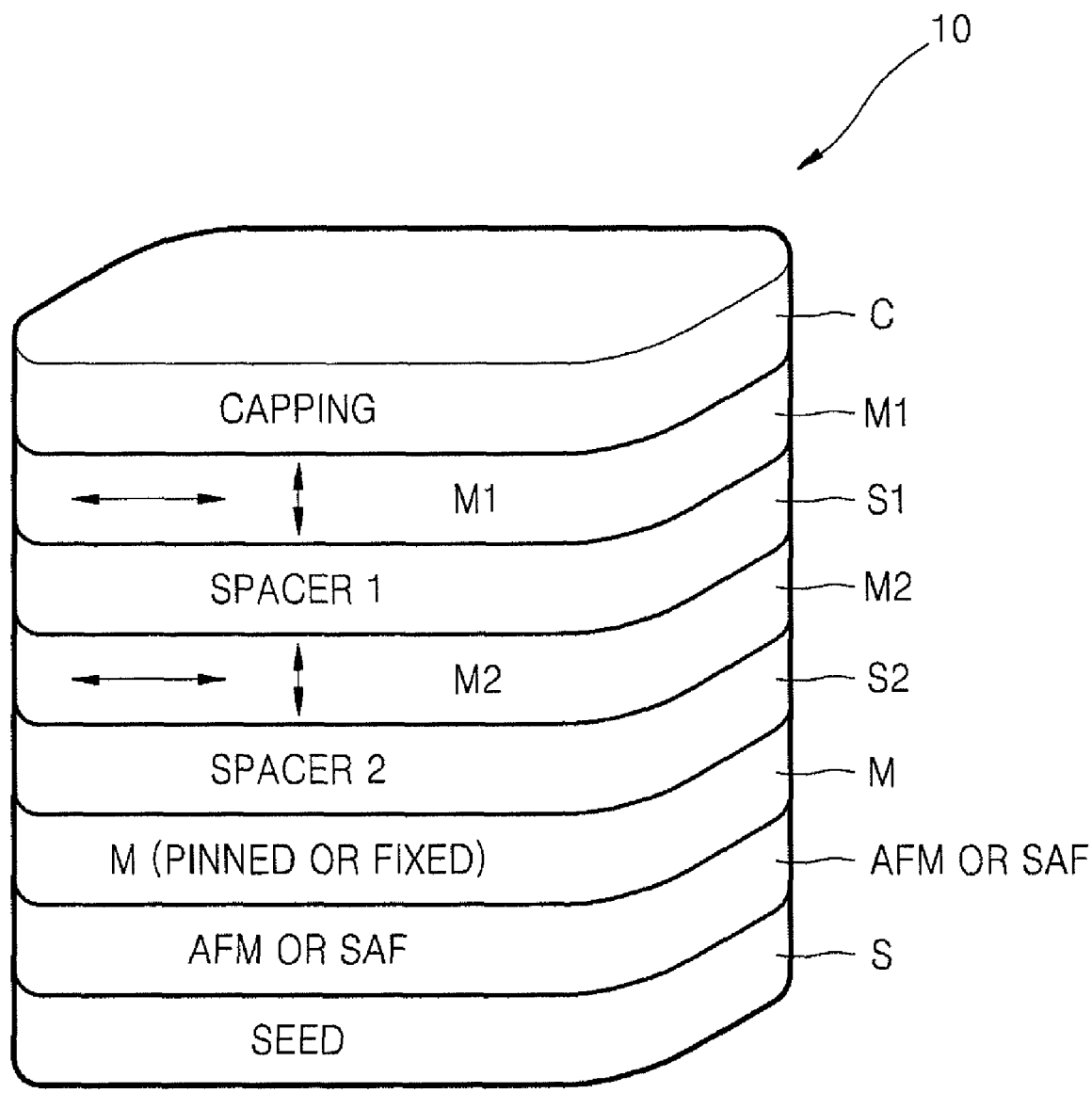
FIG. 13 schematically illustrates another exemplary embodiment of the present invention. The multi-bit MRAM 10 includes magnetic and non-magnetic mulitlayers with rounded ends.

Memory cells according to the invention described herein may have rounded ends to suppress magnetic domain nucleation as shown in FIG. 13, and an aspect ratio of each cell may be in a range of about 1.1 to 5.0.

Figure 2:
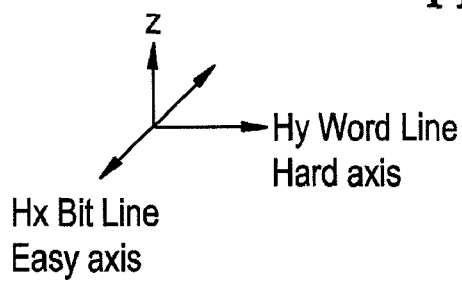
FIG. 2 schematically depicts parameters used in a model calculation of a multi-bit memory according to an exemplary embodiment of the present invention.
Figure 2:
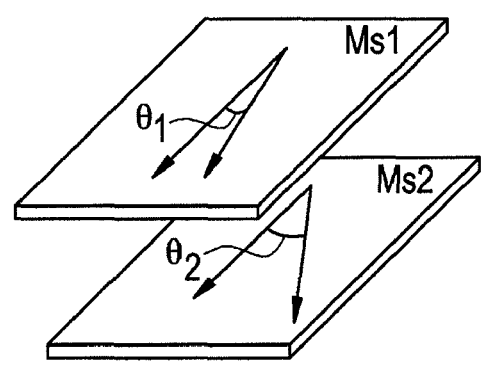

FIG. 2 schematically depicts parameters used in a model calculation of a multi-bit memory according to the invention. During the write process, two electrical currents are applied, one along the Bit line Hx (the easy axis) and the other along the Word line Hy (the hard axis). Thus, two orthogonal magnetic fields are. generated.

As shown in FIG. 2, Ms1 and Ms2 represent the saturation magnetization of magnetic layer M1 and M2, respectively, and are measured in teslas (symbol T), the SI derived unit of magnetic flux density (or magnetic induction) used to define the intensity (density) of a magnetic field. The angles Θ1 and Θ2 are the magnetization angle of layers M1 and M2 from the long axis (or easy axis) of a cell.

Shape anisotropy fields Hk1 and Hk2 of M1 and M2 are defined as (Ny−Nx)Ms1 and (Ny−Nx)Ms2, respectively, where Ny and Nx are the demagnetizing factor along the x and y-axis. Similarly, Nz is a demagnetizing factor along the z-axis.

In the example of FIG. 2, two magnetic pulse fields are used in the model calculation. Hy is the hard axis magnetic field from the Word line applied along the positive direction only and Hx is the long axis magnetic field from the Bit line applied along the positive and negative x direction.

The pulse duration of Hx and Hy are different where Hx is longer than Hy. The ratio of Hy/Hk2, Hx/Hy and Ms1/Ms2 are represented by ry, rx and R in the calculation, where:

$$Hy = ry(Ny-Nx)Ms2 \qquad \text{(equation 1)};$$

$$Hx = rxHy = rxry(Ny-Nx)Ms2 \qquad \text{(equation 2); and}$$

$$Ms1 = RMs2 \qquad \text{(equation 3)}.$$

Figure 3:
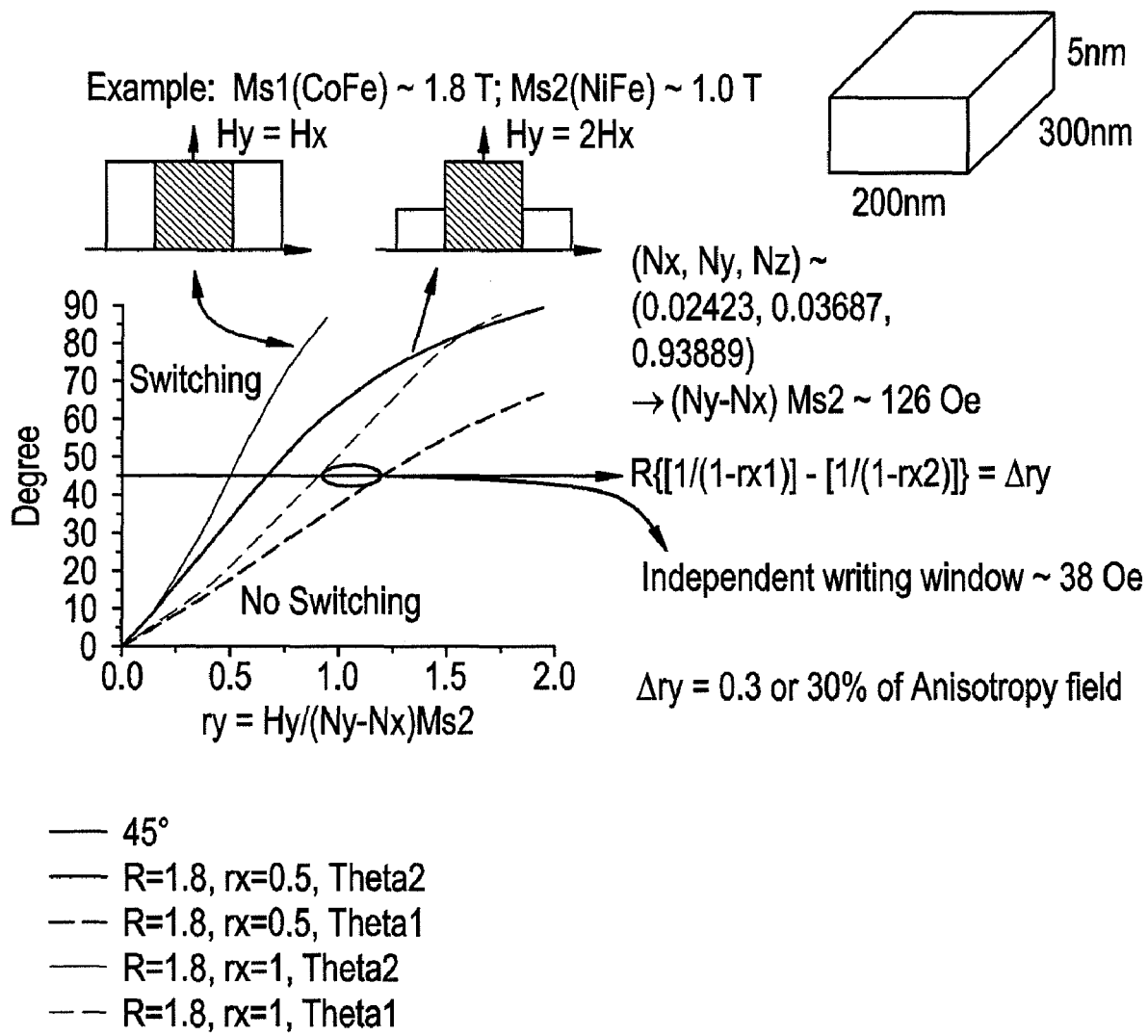
FIG. 3 is an example of a calculation showing a region where precessional switching is feasible and non-feasible (a cell writing window) in an exemplary method of the invention.

FIG. 3 is an example of a calculation showing a region where precessional switching is feasible and non-feasible (a cell writing window) in an exemplary method of the invention. In the exemplary embodiment of FIG. 3, CoFe and NiFe are used as the materials for M1 and M2, respectively.

For this particular example, the memory cell has a rectangular shape with a dimension of 200 nm×300 nm×5 nm as shown. The accompanying graph shows the angles of Θ1 and Θ2 in degrees as a function of ry for two values of rx, where $$rx = Hy/(Ny-Nx)Ms2.$$

As shown, the region where precessional switching is feasible and non-feasible is marked "Switching" and "No Switching". In this exemplary embodiment, the cell has a writing window of about 38 Oe or 30% of the shape anisotropy field (Ny−Nx) Ms2. In the embodiment, for an angle >45°, switching is possible and no switching is possible for an angle <45°

Figure 4:
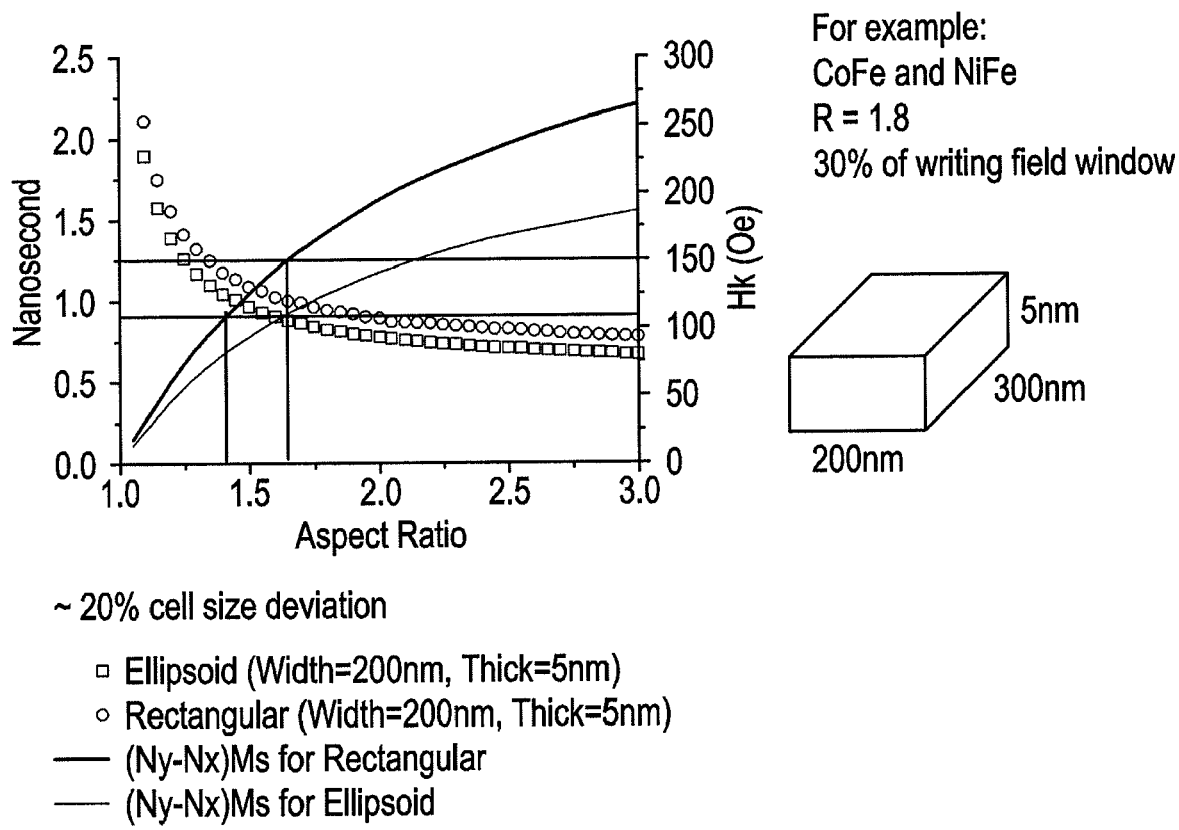
FIG. 4 depicts the precession period of the spin shown as a function of the aspect ratio for two different cell shapes, rectangular and ellipse according to the cell writing window calculated in FIG. 3.

FIG. 4 depicts the precession period of the spin shown as a function of the aspect ratio for two different cell shapes, rectangular and ellipse according to the cell writing window calculated in FIG. 3.

Using the 30% writing window depicted in FIG. 3, this translates into a cell size deviation tolerance of about 20% and a switching time in the order of 1 ns. Large cell size deviation tolerances increase the chance of independent addressing of M1 and M2.

FIGS. 5A-5D graphically illustrate switching according to an exemplary method of the invention when fields Hx and/or Hy are applied and, more specifically, in which Mx indicates normalized magnetization of magnetic layers of a non-selected cell by magnetic fields Hx and Hy. Particularly, FIGS. 5A-5B graphically illustrate the change of the magnetization vector over a period of time (dM/dt) when each non-selected layer (e.g., magnetic layer M1 or magnetic layer M2) is exposed to magnetic pulse fields Hy and/or Hx. In these examples, magnetic layer M1 has a saturation magnetization Ms1=1.5 T and magnetic layer M2 has a saturation magnetization Ms2=1 T.

In FIGS. 5A-5D, the evolution of the magnetization of Ms1 and Ms2 with time are found by solving the LLG equation for dM/dt.

Figure 5A:
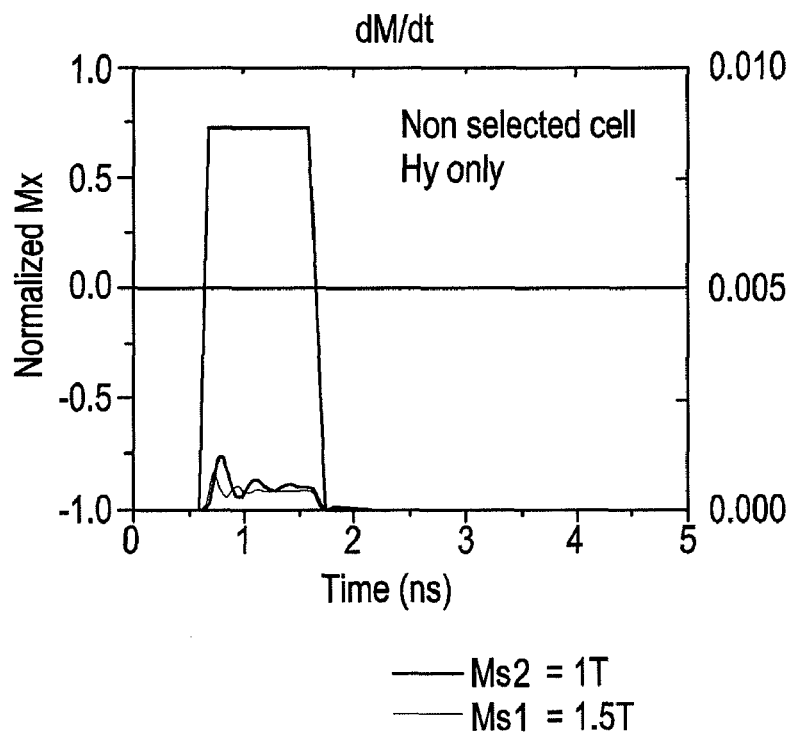
FIGS. 5A-5D graphically illustrate switching according to an exemplary method of the invention when fields Hx and/or Hy are applied.
Figure 5B:
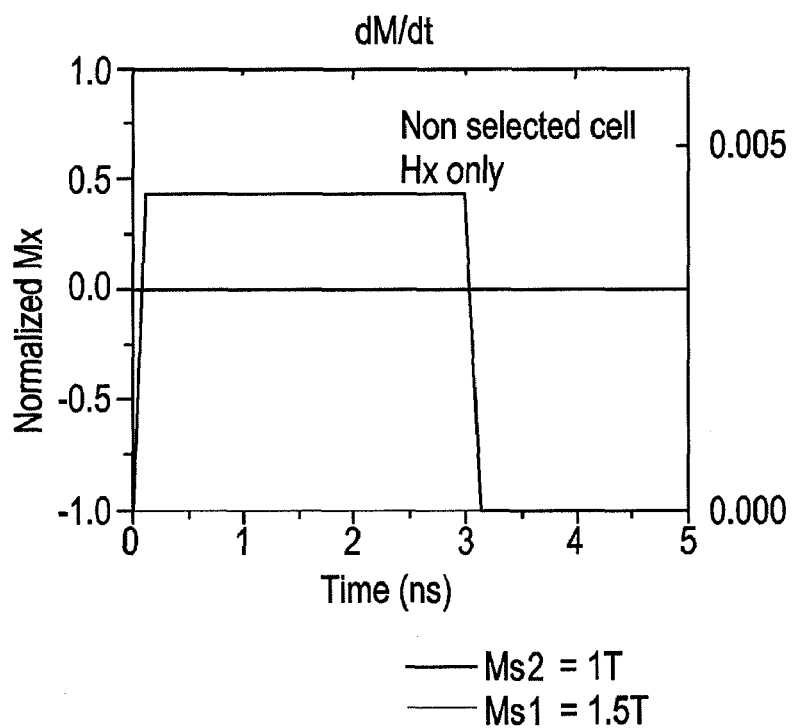

Both magnetizations are initially along the −x direction. FIGS. 5A and 5B show the magnetization of the non-selected layer when exposed to only Hy or Hx. In this case, no switching occurs.

Figure 5C:
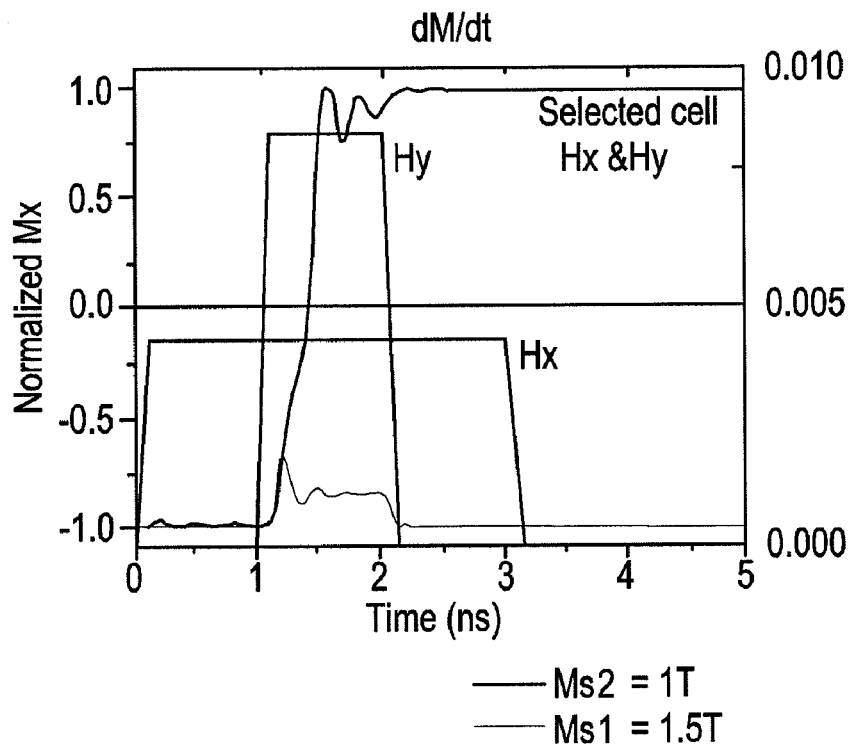

FIG. 5C shows the selected cell when Hx/Hy=½. In this case, Ms2 has switched to a +x direction while Ms1 remains unchanged as the field pulses were terminated.

Figure 5D:
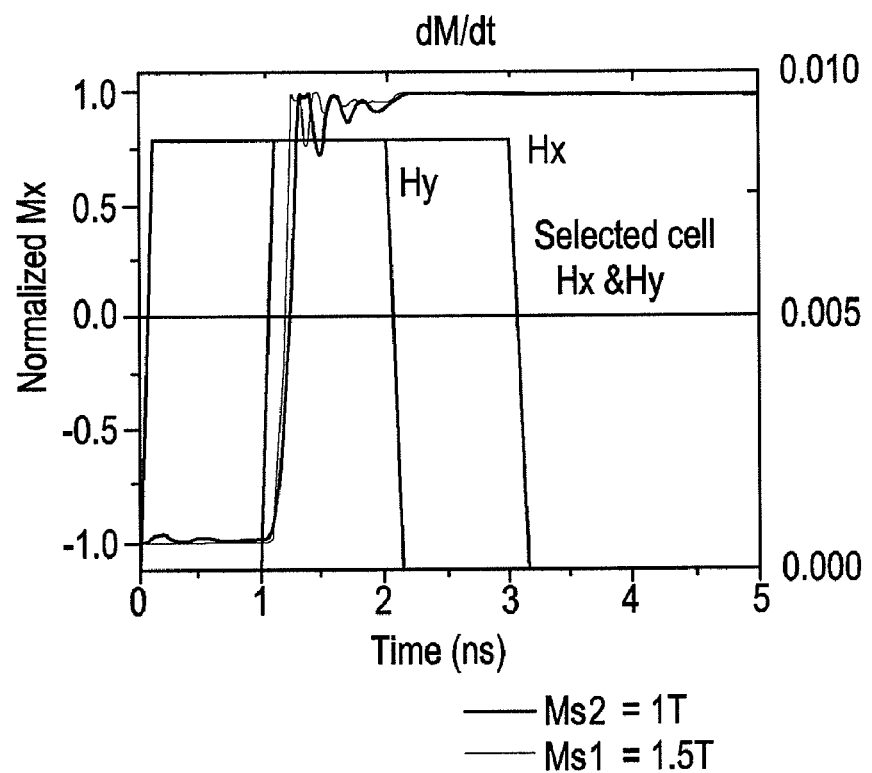

FIG. 5D shows the switching of both Ms1 and Ms2 in the selected cell by having Hx/Hy=1.

Figure 6:
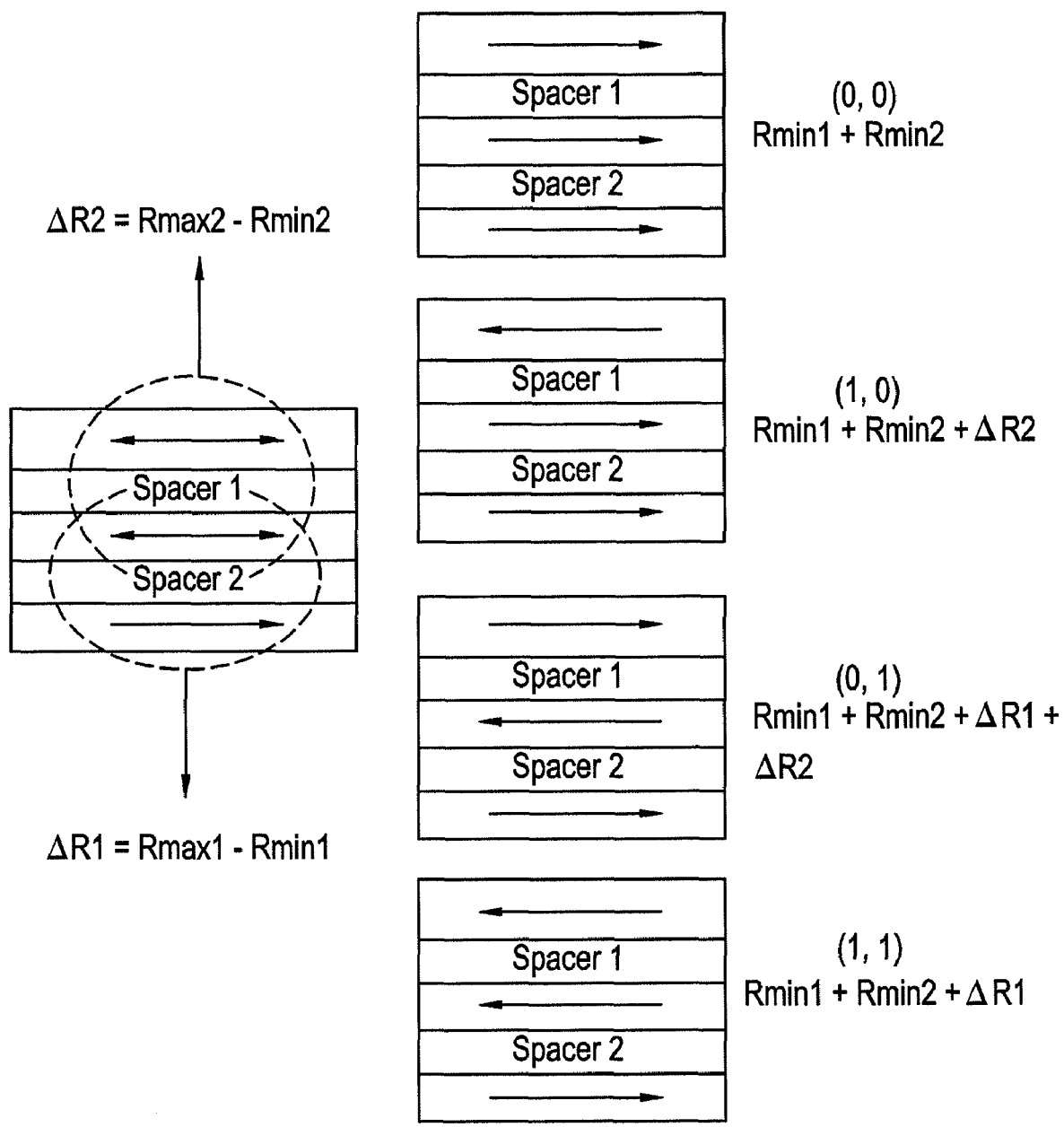
FIG. 6 depicts four resistance states for four different magnetization configurations in Ms1 and Ms2, and its correlation to four different readback signal levels.

FIG. 6 depicts four resistance states for four different magnetization configurations in Ms1 and Ms2, and its correlation to four different readback signal levels. In particular, "Rmin1" indicates minimum resistance of a stack structure ST2 consisting of a magnetic layer M (pinned layer), a second spacer S2 and a second ferromagnetic layer M2. That is, "Rmin1" indicates the resistance of the stack structure ST2 when magnetization directions of the magnetic layer M and the second ferromagnetic layer M2 are the same. "Rmin2" indicates minimum resistance of a stack structure ST1 consisting of the second ferromagnetic layer M2, a first spacer S1 and a first ferromagnetic layer M1. That is, "Rmin2" indicates the resistance of the stack structure ST1 when magnetization directions of the first and second ferromagnetic layers M1 and M2 are the same. "Rmax1" indicates maximum resistance of the stack structure ST2 in which magnetization directions of the magnetic layer M and the second ferromagnetic layer M2 are antiparallel. "Rmax2" indicates maximum resistance of the stack structure ST1 in which magnetization directions of the first and second ferromagnetic layers M1 and M2 are antiparallel.

As shown in FIG. 6, when the two magnetic layers are in parallel alignment, electrons experience less scattering and hence, lower electrical resistance compared to high resistance due to a high scattering rate when the layers are in an anti-parallel configuration. Thus, one non-magnetic interface generates two signal levels, "1" and "0". The difference between high and low resistance states range from a few percent in GMR to nearly 100% in TMR. Therefore, a multilevel signal may be created by having more than one spacer with distinct material properties.

Multi-bit MRAM of the present invention may be created by growing magnetic multilayers with distinct, saturation magnetization free magnetic layers, where each free layer can store one binary bit information. The memory cell shape can be, for example, rectangular or elliptical. The layers may be formed by film-patterning, etching, and polishing techniques known in the art.

Figure 7:
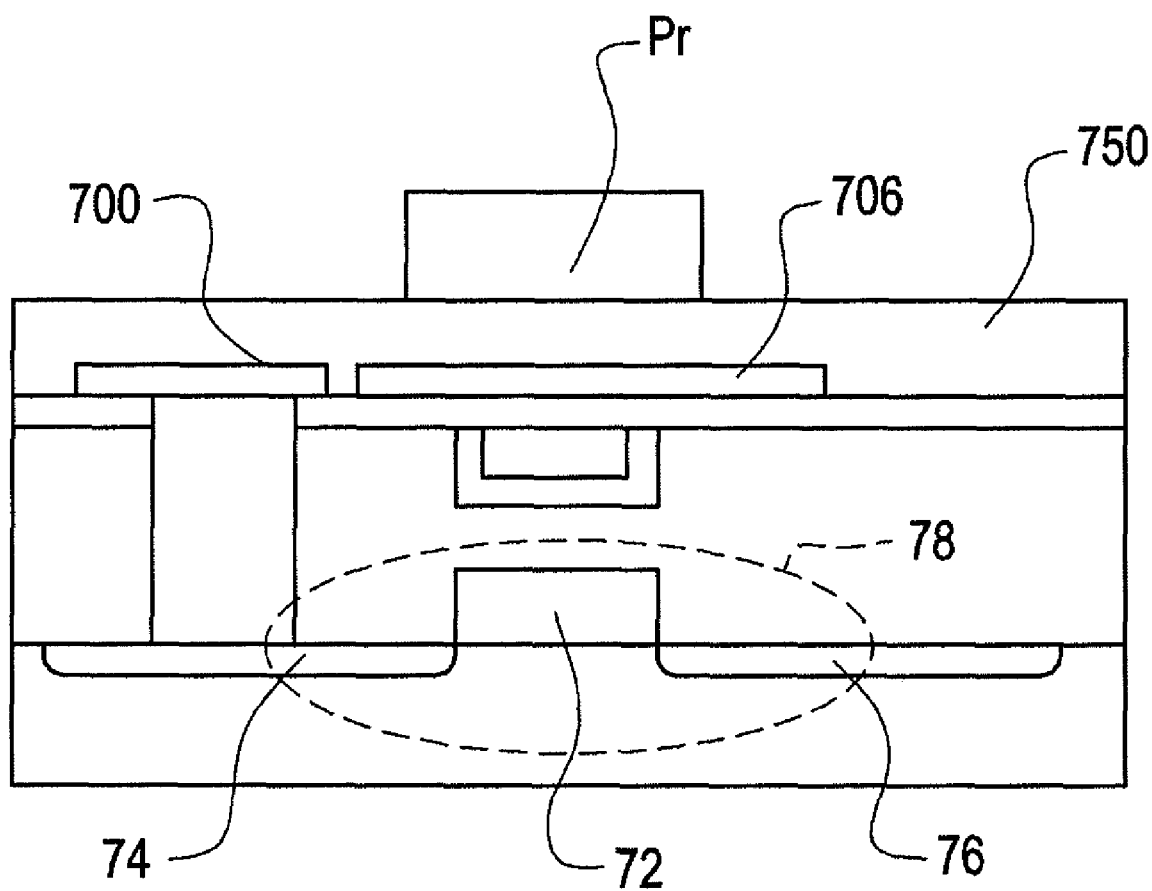
FIG. 7 illustrates a stage of forming a cell structure according to the invention prior to an etching process to create the bits.

As shown in FIG. 7, during the manufacturing process, source area 74 is formed to the left of gate 72 while common drain area 76 is formed to the right of gate 72. These form the basic elements of a transistor structure 78. Magnetic multi-layer 750 is formed to cover the first and second pads 700, 706. The magnetic multilayer 750 contains more than one free ferromagnetic layer. Also formed is pattern pr above a predetermined area of multilayer 750. In other words, the magnetic multilayer 750 in FIG. 7 indicates sequentially stacked layers to form the memory bits 80 in FIG. 8. The composition of magnetic multi layer 750 and memory bits 80 is the same composition as a storage node 10 shown in FIG. 1.

Figure 8A:
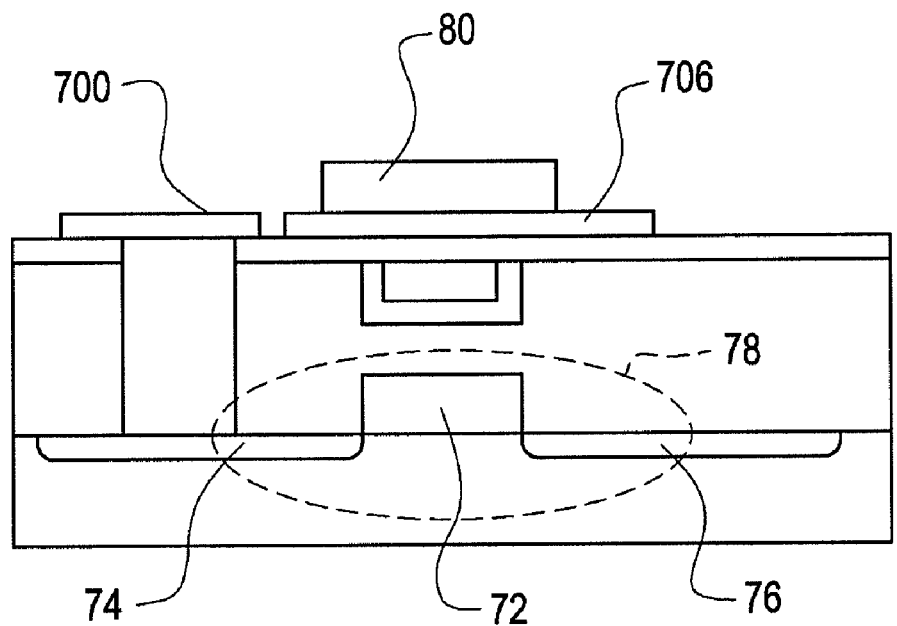
FIGS. 8A and 8B illustrate a stage of forming a cell structure according to the invention after an etching process to create the bits.
Figure 8B:
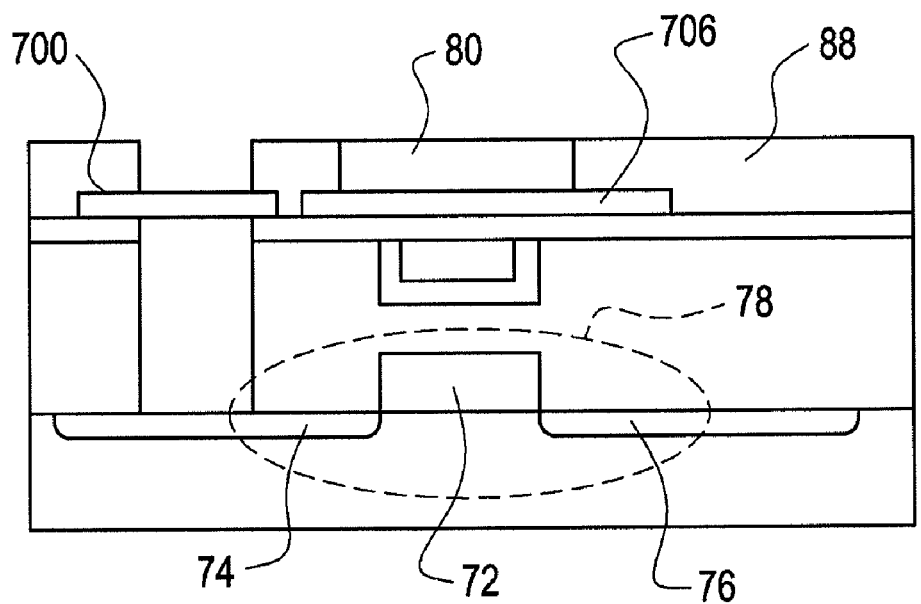
Figure 9:
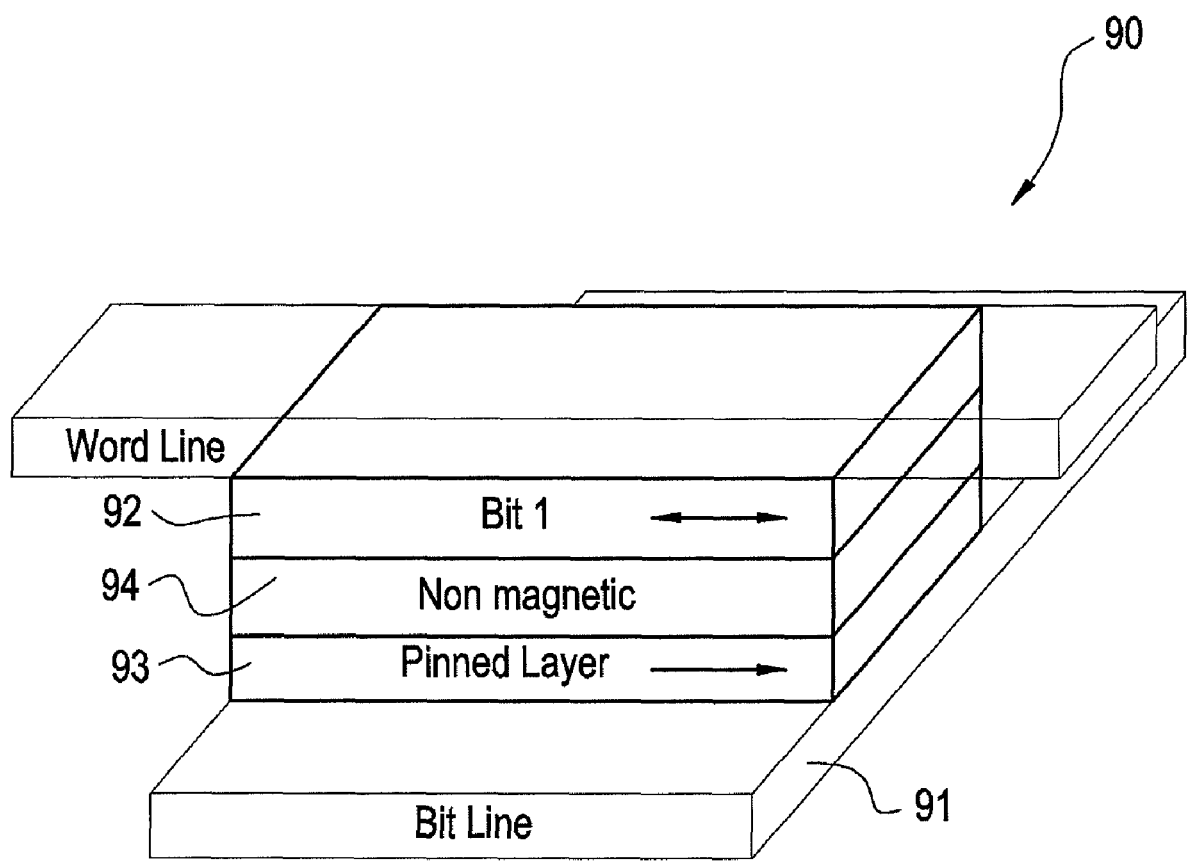
FIG. 9 illustrates a basic MRAM cell structure with one memory cell located at the intersection between Word and Bit lines.

FIG. 8A shows the memory bits 80 that have been formed from layer 750 using pr as the mask through multiple steps of chemical and/or plasma etching processes. The etching process is stopped once layer 706 is exposed. The remaining portions of pr must be removed through further chemical and/or plasma cleaning processes. Subsequently, as shown in FIG. 8B, layer 88 is formed to cover the memory bits 80 and first and second pads 700, 706. Layer 88 may be smoothed until the memory bits 80 are exposed. Methods for smoothing layer 88 may include, for example, etching and chemical/mechanical polishing. Layer 88 is non-conductive and its function is to isolate the top and bottom contact pad 706.

Figure 10:
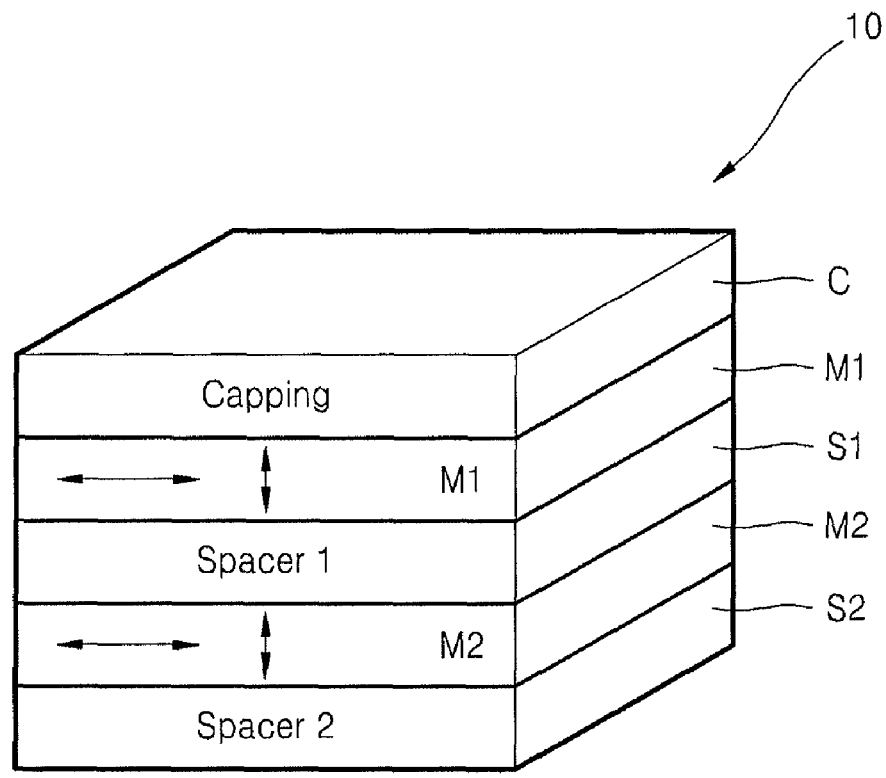
FIG. 10 schematically illustrates a storage node of an MRAM according to an exemplary embodiment of the present invention.
Figure 10:
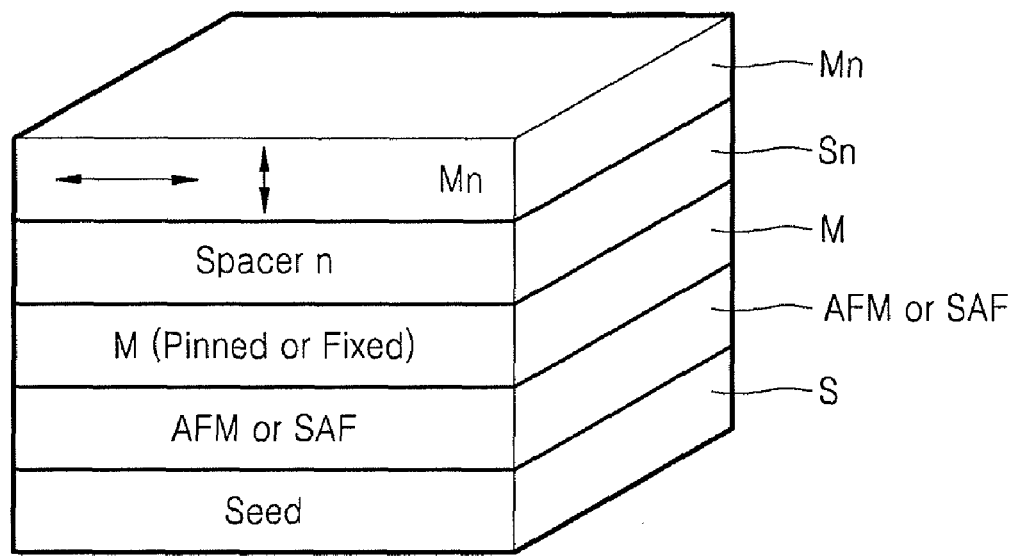

FIG. 10 shows a storage node 10 of an MRAM according to an exemplary embodiment of the present invention, including magnetic and non-magnetic multilayers. Particularly, FIG. 10 illustrates the storage node 10 holding more than two bits of information utilizing the same principles as for the two bit storage node of FIG. 1.

Magnetic layers M1, M2 and Mn are the data layers where information is stored, where Mn is the nth magnetic layer of the storage node 10 capable of storing n bits of information. As previously described, the magnetization of layers M1, M2 and Mn can be changed via an externally applied magnetic field and/or spin-polarized electrical current (not shown).

In this example, a non-magnetic spacer layer S2 is accommodated between magnetically changeable ferromagnetic layer M2 and the next magnetically changeable ferromagnetic layer of Mn layers, with additional spacer layers accommodated between additional magnetically changeable ferromagnetic layers. A non-magnetic space layer Sn is accommodated between magnetically changeable ferromagnetic layer Mn and magnetic layer M.

Therefore, two or more bits of information can be stored using one memory cell in the MRAM architecture. This structure reduces the number of bit and word lines used for the reading and writing processes. As a direct result, a higher magnetic memory density is achieved.

Storing two bits of information at one cross-point according to exemplary embodiments of the invention is possible since writing or changing the magnetization of the free layers of can be accomplished without affecting the information already stored in the other free layer.

The difference in saturation magnetization allows recording information in one bit without affecting the information in the other bit. This allows for selective writing.

In the writing method of the invention, the second applied magnetic field (the spin-precessional excitation field) may be turned-off as soon as the magnetization of the one free layer, for example, layer B, has precessed to more than ½ but less than ¾ of the precession cycle. Subsequently, the first applied magnetic field (the easy axis field) is turned-off after the second applied magnetic field is turned-off. Likewise, the pulse of the easy axis field should have a longer duration than a pulse of the spin-precessional excitation field. In an exemplary embodiment, the pulse duration of the easy axis field is in a range of about 0.2 to 10 ns, while a pulse duration of the spin-precessional excitation field may be in a range of about 0.01 to 5 ns.

In addition, the magnetic layers M1, M2 of the invention may have the same or differing spin precession frequencies. Also the magnetic layers M1, M2 may have the same or differing magnetic damping constants to provide for better energy dissipation, as needed.

Using the aforementioned features, selective writing of the magnetically changeable ferromagnetic layers may be performed using a combination of a saturation magnetization ratio, magnetic isotropy ratio, easy to hard axis field magnitude ratio, and/or a spin polarized current density ratio. The ratio becomes important for making the magnetically changeable layers react differently to the applied field. When the magnetically changeable layers have the same properties, then it becomes difficult to write information in one layer without disturbing the remaining layers.

For example, take an embodiment with magnetically changeable layers 1 and 2. One of the most critical properties is the (saturation magnetization) x (layer thickness). This value represent the amount of energy required to write information in this selected layer. If Ms=Saturation magnetization, and t=layer thickness, then for layer 1, the energy required for writing is proportional to $Ms_1t_1$. Similarly the energy to write information in layer 2 is proportional to $Ms_2t_2$.

Now, in an exemplary embodiment, when $Ms_1t_1>Ms_2t_2$, if the first writing field supplies an energy>$Ms_1t_1$, then both layer 1 and 2 will be written. If $Ms_1t_1$>writing field energy>$Ms_2t_2$, only layer 2 will be written. Therefore, the ratio of $Ms_1t_1/Ms_2t_2$>1 to 5. The larger the ratio, the bigger the difference in the energy required to write information in the layer. Thus, selective writing is performed.

A second method to distinguish the two layers is by using ferromagnetic material with distinct magnetic anisotropy constants, which is an intrinsic material property commonly represented by the symbol K. Suppose K1 and K2 are defined as the magnetic anisotropy of layer 1 and 2, respectively. In an exemplary embodiment, then the ratio of K1/K2>1 to 5.

The easy to hard axis field magnitude ratio depends on the shape of the memory cell. In an exemplary embodiment, the easy to hard axis field magnitude ratio is the same as the length/width ratio of the cell.

The spin-polarized current (SPC) is the amount of current required to write information in the layer. In exemplary embodiments, when using the spin-polarized current method, then there is no need to create a magnetic field. This is an alternative writing method. Further, the amount of current required depends on all the parameters mentioned above such as (Ms)×(t) and magnetic anisotropy constant (K). Therefore, in an exemplary embodiment, if layer 1 requires SPC1 and layer 2 requires SPC2, then SPC1/SPC2>1 to 5.

Figure 11:
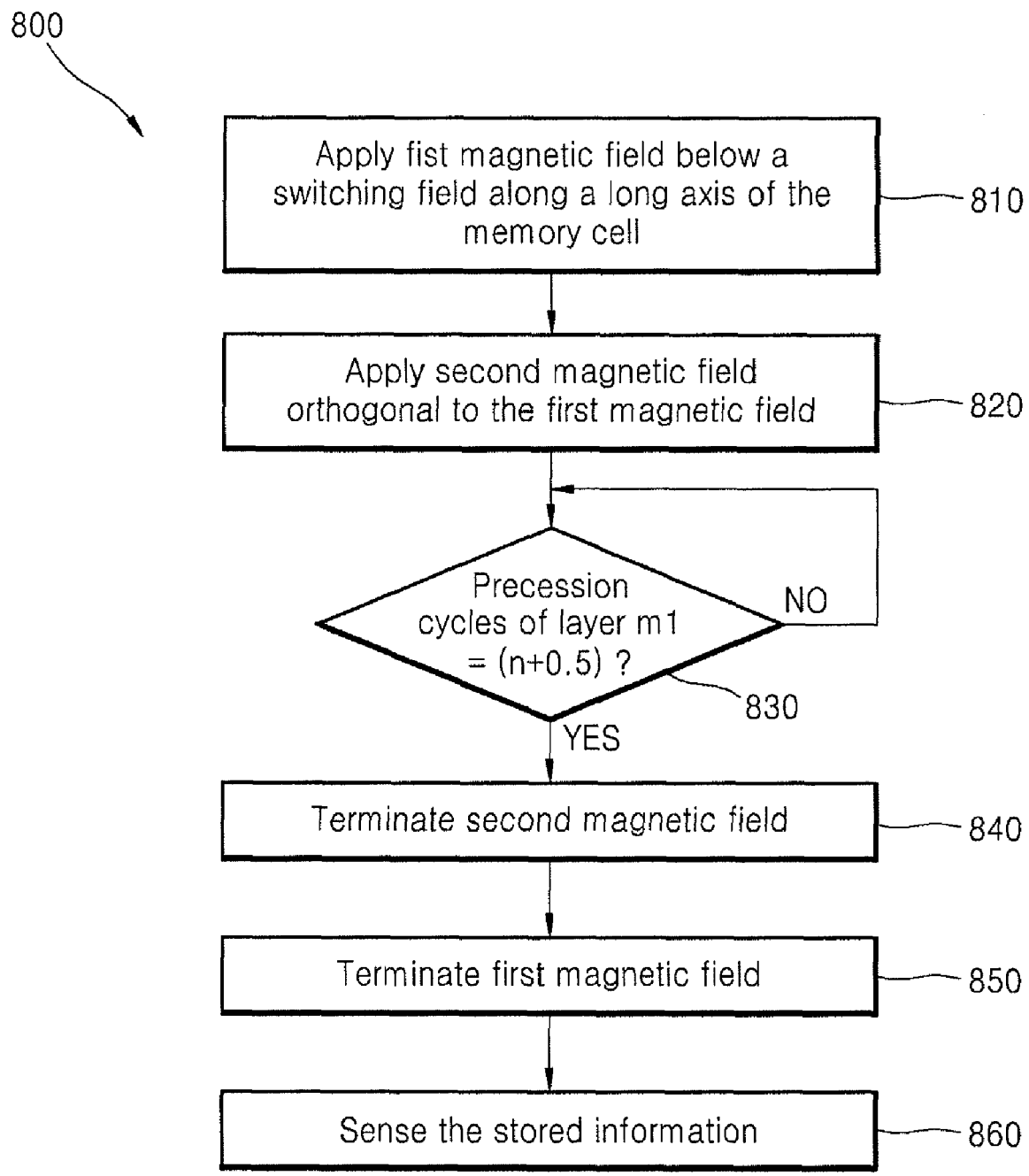
FIG. 11 illustrates an exemplary writing method of the present invention.

In FIG. 11, a writing method 800 according to an exemplary embodiment of the invention for a magnetic memory includes a step for applying a first magnetic 810 field below a switching field along a long axis of the memory cell and applying a second magnetic 820 field orthogonal to the first magnetic field, wherein the first magnetic field is turned-off in terminating step 850 after the second magnetic field is turned-off in terminating step 840. Therefore, it is preferred in this exemplary embodiment of the invention that a pulse of the first magnetic field has a longer duration than a pulse of the second magnetic field. The step for terminating the second magnetic field may be initiated by precession counting step 830 when the magnetization of the first magnetically changeable ferromagnetic layer M1 has been through (n+½) precession cycles, where n is a number of precession cycles. In another exemplary embodiment, the step for terminating the second magnetic field may be initiated by precession counting step 830 when the magnetization of one of the first and second magnetically changeable ferromagnetic layers M1 and M2 has been through (n+½) precession cycles, where n is the number of precession cycles.

The writing method according to an exemplary embodiment of the invention is also capable of independently writing to the first and second magnetically changeable ferromagnetic layers M1 and M2 using a single writing event based on the properties of each magnetically changeable layer as described above. For example, the first and second magnetically changeable ferromagnetic layers M1 and M2 can be written separately using spin-polarized current induced switching by creating asymmetry in a switching current threshold for the first and second magnetically changeable ferromagnetic layers M1 and M2. In another example, the first and second magnetically changeable ferromagnetic layers M1 and M2 can be written using spin polarized current induced switching in combination with an externally applied magnetic field. A magnetoresistance effect may be used at any stage in sensing step 860 for sensing the stored information in each of the first and second magnetically changeable ferromagnetic layers M1 and M2.

In an exemplary embodiment of the invention where an easy axis magnetic field (+Hx or −Hx) used to define the final state of the memory (1 or 0) is combined with an orthogonal hard axis excitation field (+Hy or −Hy) to initiate spin precession, it is preferred that a fast Hy field is utilized, where a rise time of the pulse of the second magnetic field (Hy field) is equal to or less than 1 ns. Particularly, it is preferred that a pulse duration of the first magnetic field is in a range of 0.2 to 10 ns, while a pulse duration of the second magnetic field is in a range of 0.01 to 5 ns. In addition, the pulse of the magnetic fields may be shaped to generate a fast rising field to create a rise time that activates spin precession. For example, the pulse of the magnetic fields may be shaped in one of a trapezoidal or exponential shape.

As previously described, layers M1 and M2 may also have distinct magnetic and physical properties, including damping constants, where the first magnetically changeable ferromagnetic layer M1 may have a damping constant greater than the damping constant of the second magnetically changeable ferromagnetic layer M2 such that a writing response time of the first magnetically changeable ferromagnetic layer M1 is delayed to accomplish independent writing. Similarly, first magnetically changeable ferromagnetic layer M1 may have a damping constant lower than the damping constant of the second magnetically changeable ferromagnetic layer M2 to achieve the opposite result. One exemplary method of increasing the damping coefficient of one of the first and second magnetically changeable ferromagnetic layers M1 and M2 is through the use of a capping layer.

The saturation magnetization and/or magnetic anisotropy ratio of the first and second magnetically changeable ferromagnetic layers M1 and M2 may also be controlled in order to achieve independent writing. The method for selective writing to the first and second magnetically changeable ferromagnetic layers M1 and M2 may be performed using a combination of a saturation magnetization ratio, magnetic isotropy ratio, easy to hard axis field magnitude ratio, and/or a spin polarized current density ratio.

Furthermore, it is preferred that the first and second magnetically changeable ferromagnetic layers M1 and M2 and the first spacer SI as a structure have a differing magnetoresistance (MR) ratio than a structure including the second magnetically changeable ferromagnetic layer M2, the second spacer S2, and the reference layer M. Furthermore, an orthogonal unidirectional anisotropy may be induced in one of the first and second magnetically changeable ferromagnetic layers M1 and M2. The magnetization pinning axis of the ferromagnetic reference layer M may also be set to be orthogonal to the long axis of the memory cell.

In an exemplary embodiment of the invention storing two bits of information, magnetically changeable ferromagnetic layers are written as (1, 1) and (0, 0) using a single writing event, and (1, 0) and (0, 1) using two writing events. For example, in further view of FIGS. 5C and 5D, the two magnetically changeable ferromagnetic layers are written as (1, 0) by first writing a 1 in both of the first and second magnetically changeable ferromagnetic layers M1 and M2, followed by a second writing event to write a 0 in the magnetically softer ferromagnetic layer. In another example, the two magnetically changeable ferromagnetic layers are written as (0, 1) by first writing a 0 in both magnetically changeable ferromagnetic layers, followed by a second writing event to write a 1 in the magnetically softer ferromagnetic layer. That is, the magnetically changeable ferromagnetic layers (M1, M2) may be written into one of four different magnetization configurations (1, 1), (0, 0), (1, 0), and (0, 1), as shown in FIG. 6, using either a single writing event or two writing events, in which M1=0 or 1 and M2=0 or 1. For example, the second configuration shown in FIG. 6 illustrates a (1, 0) configuration, where M1=1 and M2=0. The value of the binary information bit stored in one of the magnetically changeable ferromagnetic layers may be represented by a 0 or a 1 depending on the orientation of magnetization of the changeable ferromagnetic layer in relation to the fixed orientation of magnetization of the magnetic layer M. For example, FIG. 6 shows that if the orientation of magnetization of the changeable ferromagnetic layer (M1 or M2) is aligned in parallel with the orientation of magnetization of the magnetic layer M, the binary information bit stored in the changeable ferromagnetic layer (M1 or M2) is represented by a value of 0. Conversely, if the orientation of magnetization of the changeable ferromagnetic layer (M1 or M2) is in a direction opposite or anti-parallel to the orientation of magnetization of the magnetic layer M, the binary information bit stored in the changeable ferromagnetic layer (M1 or M2) is represented by a value of 1.

Figure 12:
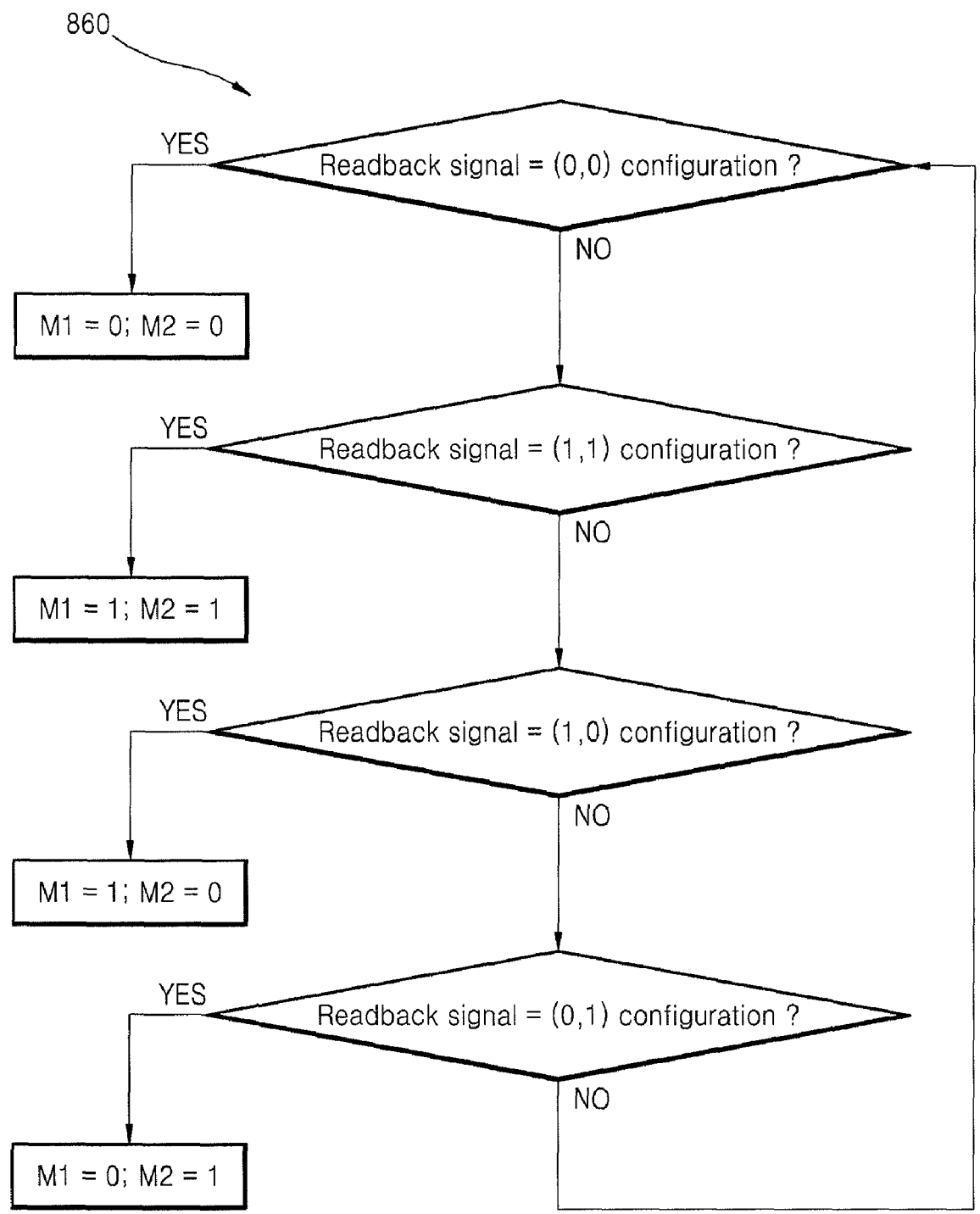
FIG. 12 illustrates an exemplary step for sensing stored information according to the present invention.

In an exemplary embodiment of the preferred invention, illustrated in FIG. 12, the step for sensing the stored information 860 in each of the first and second magnetically changeable ferromagnetic layers M1 and M2 and when the first and second magnetically changeable ferromagnetic layers M1 and M2 are in a (1, 1) configuration (i.e., when M1=1 and M2=1), a readback signal will be different from a (0, 0) configuration (i.e., when M1=0 and M2=0) by a magnetoresistance ratio of a structure including the second magnetically changeable ferromagnetic layer M2, the second spacer S2, and the reference layer M. Additionally, when the first and second magnetically changeable ferromagnetic layers M1 and M2 are in a (1, 0) configuration (i.e., when M1=1 and M2=0), a readback signal will be different from a (0, 0) configuration by a magnetoresistance ratio of a structure including the first and second magnetically changeable ferromagnetic layers M1 and M2 and the first spacer S1. Additionally, when the first and second magnetically changeable ferromagnetic layers M1 and M2 are in a (0, 1) configuration (i.e., when M1=0 and M2=1), a readback signal will be different from a (0, 0) configuration by the sum of magnetoresistance ratios of a first structure including the second magnetically changeable ferromagnetic layer M2, the second spacer S2, and the reference layer M and a second structure including the first and second magnetically changeable ferromagnetic layers M1 and M2 and the first spacer S1. The readback signal states may be increased by increasing a difference between a magnetoresistance ratio of a first structure including the second magnetically changeable ferromagnetic layer M2, the second spacer S2, and the reference layer M and a magnetoresistance ratio of a second structure including the first and second magnetically changeable ferromagnetic layers M1 and M2 and the first spacer S1.

Accordingly, the present invention allows for improved data density by using a multi-bit MRAM structure, where a plurality of magnetically changeable ferromagnetic layers are used, each layer storing one bit.

Further, the present invention may use spin precessional switching which is energy efficient.

Finally, high frequency cell writing is possible, therefore leading to a higher data transfer rate.

Although exemplary embodiments of the present invention have been described for illustrative purposes, those skilled in the art will appreciate that various modifications, additions and substitutions are possible, without departing from the scope and spirit of the invention as disclosed in the accompanying claims, including the full scope of equivalents thereof.

What is claimed is:

1. A writing method for a magnetic memory comprising a memory cell comprising at least first and second magnetically changeable ferromagnetic layers, and a ferromagnetic reference layer, the first magnetically changeable ferromagnetic layer being disposed on the second magnetically changeable ferromagnetic layer, and the second magnetically changeable ferromagnetic layer being disposed on the ferromagnetic reference layer, the method defining a writing event comprising:

applying a pulse of a first magnetic field below a switching field along a first axis of the memory cell for a first duration;

applying a pulse of a second magnetic field along a second axis orthogonal to the first magnetic field for a second duration which is shorter than the first duration, wherein the first magnetic field is turned-off after the second magnetic field is turned-off;

determining whether a magnetization of one of the first and second magnetically changeable ferromagnetic layers has been through (n+½) precession cycles, where n is a number of precession cycles; and terminating the second magnetic field when the magnetization of one of the first and second magnetically changeable ferromagnetic layers has been through the (n+½) precession cycles.

2. The writing method for a magnetic memory according to claim 1, wherein the first and second magnetically changeable ferromagnetic layers are independently written using a single writing event based on properties of each of the first and second magnetically changeable ferromagnetic layers.

3. The writing method for a magnetic memory according to claim 1, wherein the pulse of the second magnetic field has a rise time which is equal to or less than 1 ns.

4. The writing method for a magnetic memory according to claim 1, wherein the first magnetically changeable ferromagnetic layer has a damping constant greater than a damping constant of the second magnetically changeable ferromagnetic layer such that a writing response time of the first magnetically changeable ferromagnetic layer is delayed to accomplish an independent writing.

5. The writing method for a magnetic memory according to claim 1, wherein the pulse of the first magnetic field and the pulse of the second magnetic field are shaped to generate a fast rising field to create a rise time that activates a spin precession.

6. The writing method for a magnetic memory according to claim 1, wherein the pulse of the first magnetic field and the pulse of the second magnetic field are shaped in one of a trapezoidal or exponential shape.

7. The writing method for a magnetic memory according to claim 1, further comprising sensing stored information in each of the first and second magnetically changeable ferromagnetic layers using a magnetoresistance effect.

8. The writing method for a magnetic memory according to claim 1, further comprising terminating the second magnetic field when a magnetization of the first magnetically changeable ferromagnetic layer has been through (n+½) precession cycles, where n is the number of precession cycles.

9. The writing method according to claim 1, wherein the first duration is in a range of 0.2 to 10 ns, while the second duration is in a range of 0.01 to 5 ns.

10. The writing method according to claim 1, further comprising controlling at least one of a saturation magnetization and magnetic anisotropy ratio of the first and second magnetically changeable ferromagnetic layers to achieve an independent writing.

11. The writing method according to claim 1, wherein the memory cell further comprises a first spacer layer interposed between the first and second magnetically changeable ferromagnetic layers, and a second spacer layer interposed between the ferromagnetic reference layer and the second magnetically changeable ferromagnetic layer, and wherein the first and second magnetically changeable ferromagnetic layers and the first spacer as a structure have a differing MR ratio than a structure including the second magnetically changeable ferromagnetic layer, the second spacer, and the ferromagnetic reference layer.

12. The writing method according to claim 1, wherein the first and second magnetically changeable ferromagnetic layers are written as (1,1) and (0,0) using a single writing event, and (1,0) and (0,1) using two writing events.

13. The writing method according to claim 1, wherein the second magnetically changeable ferromagnetic layer is magnetically softer than the first magnetically changeable ferromagnetic layer such that the second magnetically changeable ferromagnetic layer requires a lesser amount of energy to write information therein than an amount of energy required by the first magnetically changeable ferromagnetic layer to write information therein, the two magnetically changeable ferromagnetic layers are written as (1,0) by first writing a 1 in both of the first and second magnetically changeable ferromagnetic layers by a first writing event, followed by a second writing event to write a 0 in the second magnetically changeable ferromagnetic layer.

14. The writing method according to claim 1, wherein the second magnetically changeable ferromagnetic layer is magnetically softer than the first magnetically changeable ferromagnetic layer such that the second magnetically changeable ferromagnetic layer requires a lesser amount of energy to write information therein than an amount of energy required by the first magnetically changeable ferromagnetic layer to write information therein, the two magnetically changeable ferromagnetic layers are written as (0,1) by first writing a 0 in both magnetically changeable ferromagnetic layers by a first writing event, followed by a second writing event to write a 1 in the second magnetically changeable ferromagnetic layer.

15. The writing method according to claim 1, further comprising inducing orthogonal unidirectional anisotropy in one of the first and second magnetically changeable ferromagnetic layers.

16. The writing method according to claim 1, wherein the first and second magnetically changeable ferromagnetic layers are written separately using spin-polarized current induced switching by creating asymmetry in a switching current threshold for the first and second magnetically changeable ferromagnetic layers.

17. The writing method according to claim 1, wherein the first and second magnetically changeable ferromagnetic layers are written using spin polarized current induced switching in combination with an externally applied magnetic field.

18. The writing method according to claim 1, further comprising increasing a damping coefficient of one of the first and second magnetically changeable ferromagnetic layers using a capping layer disposed on the first magnetically changeable ferromagnetic layer.

19. The writing method according to claim 1, further comprising setting a magnetization pinning axis of the ferromagnetic reference layer orthogonal to the long axis of the memory cell.

20. The writing method according to claim 1, wherein the first and second magnetically changeable ferromagnetic layers are magnetically independent changeable layers.

21. The writing method according to claim 1, wherein each of the first and second magnetically changeable ferromagnetic layers holds an independent information bit.

22. The writing method according to claim 1, wherein the magnetic memory comprises only one pinned layer, the ferromagnetic reference layer having the fixed magnetization state.

23. The writing method according to claim 22, wherein the writing event includes writing a first bit of information to the first magnetically changeable ferromagnetic layer and a second bit of information to the second magnetically changeable ferromagnetic layer.

24. The writing method according to claim 1, wherein a spin precession in at least one of the first and second magnetically changeable ferromagnetic layers is initiated when the first magnetic field is combined with the second magnetic field, and the first magnetic field determines a final memory state of the at least one of the first and second magnetically changeable ferromagnetic layers.

25. The writing method according to claim 1, wherein the memory cell further comprises a first spacer layer interposed between the first and second magnetically changeable ferromagnetic layers, and a second spacer layer interposed between the ferromagnetic reference layer and the second magnetically changeable ferromagnetic layers, and wherein the first spacer layer and the second spacer layer are non-magnetic, a magnetization orientation of the second magnetically changeable ferromagnetic layer is parallel or antiparallel with respect to a magnetization orientation of the ferromagnetic reference layer, a magnetization orientation of the first magnetically changeable ferromagnetic layer is parallel or antiparallel with respect to the magnetization orientation of the second magnetically changeable ferromagnetic layer, and a difference $\Delta R1$ between maximum and minimum resistances of a stack comprising the second magnetically changeable ferromagnetic layer, the second spacer layer, and the ferromagnetic reference layer is different from a difference $\Delta R2$ between maximum and minimum resistances of a stack comprising the first magnetically changeable ferromagnetic layer, the first spacer layer, and the second magnetically changeable ferromagnetic layer.

26. The writing method according to claim 1, wherein the memory cell is disposed between a bit line extending along the first axis of the memory cell and a word line extending along the second axis of the memory cell, and the first magnetic field and the second magnetic field are applied by sending an electric current through the bit line and the word line, respectively.

* * * * *